United States Patent
Dötsch et al.

(10) Patent No.: US 6,513,140 B2
(45) Date of Patent: Jan. 28, 2003

(54) METHOD AND DEVICE FOR DECODING CONVOLUTIONAL CODES

(75) Inventors: Markus Dötsch, Schliern (CH); Peter Jung, Otterberg (DE); Jörg Plechinger, München (DE); Peter Schmidt, Erpolzheim (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/910,341

(22) Filed: Jul. 20, 2001

(65) Prior Publication Data

US 2002/0031194 A1 Mar. 14, 2002

Related U.S. Application Data (63) Continuation of application No. PCT/DE00/00019, filed on Jan. 3, 2000.

(30) Foreign Application Priority Data

Jan. 20, 1999 (DE) .......................................... 199 02 100

(51) Int. Cl.[7] .................. H03M 13/03; H03M 13/00
(52) U.S. Cl. ..................... 714/786; 714/780; 714/791; 714/794; 714/795; 375/341
(58) Field of Search ................................ 714/755, 709, 714/786, 761, 762, 774, 780, 791, 794, 795, 752; 375/341, 346, 224, 227, 285

(56) References Cited

U.S. PATENT DOCUMENTS

| | | | |
|---|---|---|---|
| 4,882,733 A | * 11/1989 | Tanner | 714/752 |
| 4,907,233 A | * 3/1990 | Deutsch et al. | 714/755 |
| 5,406,585 A | * 4/1995 | Rohani et al. | 375/341 |
| 5,790,595 A | * 8/1998 | Benthin et al. | 375/224 |

FOREIGN PATENT DOCUMENTS

| | | |
|---|---|---|
| DE | 196 03 724 A1 | 4/1997 |
| EP | 0 511 141 B1 | 7/1997 |
| WO | PCT/IB95/000912 | 5/1996 |

OTHER PUBLICATIONS

Claude Berrou et al.: "Near Optimum Error Correcting Coding and Decoding: Turbo–Codes", IEEE Transactions on Communications, vol. 44, No. 10, Oct. 1996, pp. 1261–1271.

Dan Raphaeli et al.: "Combined Turbo Equalization and Turbo decoding" Global Telecommunications Conference (Globecom), New York, U.S., IEEE, 1997, pp. 639–643.

J. Hagenauer: "Source–Controlled Channel decoding", IEEE Transactions on Communications, IEEE Inc., New York, U.S., vol. 43, No. 9, Sep. 1995, pp. 2449–2457.

Peter Jung: "Comparison of Turbo–Code Decoders Applied to Short Frame Transmission Systems", 1996 IEEE Journal on Selected areas in Communications, U.S., IEEE Inc., New York, vol. 14, No. 3, pp. 510–517.

(List continued on next page.)

Primary Examiner—Emmanuel L. Moise
(74) Attorney, Agent, or Firm—Laurence A. Greenberg; Werner H. Stemer; Gregory L. Mayback (57) ABSTRACT

Convolutional codes are decoded by calculating, for uncoded and coded symbols, a first and/or second item of reliability information ($\Lambda_u$ and $\Lambda_c$ respectively). The item of reliability information is representative of the probability that the considered $n^{th}$ uncoded or coded symbol is equal to a value i of the symbol set, under the condition that a specific sequence of received coded symbols is present. An approximate expression is proposed for calculating the second item of reliability information.

8 Claims, 2 Drawing Sheets

OTHER PUBLICATIONS

Jung et al.: "Comprehensive comparison of Turbo–Code decoders", Proceedings of the Vehicular Technology Conference, U.S., New York, IEEE, vol. Conf . 45, 1995, pp. 624–628.

Berrou et al.: "Near Shannon Limit Error—Correcting Coding and Decoding Turbo–Codes" Proc. IEEE Int. Conf. On Communications ICC'93, Genoa, 1993, pp. 1064–1070.

P. Jung: "Analyse und Entwurf Digitaler Mobilfunksysteme" [Analysis and design of mobil radio systems], B.G. Teubner, Stuttgart, 1997, pp. 343–368.

P. Jung: "Novel low complexity decoder for turbo–codes", reprinted from Electronics Letter Jan. 19, 1995, vol. 31, No. 2, pp. 36–87.

Dan Raphaeli: "Combined Turbo Equalization and Turbo Decoding", IEEE Communications Letters, vol. 2, No. 4, Aug. 1997, pp. 107–109.

* cited by examiner

METHOD AND DEVICE FOR DECODING CONVOLUTIONAL CODES

CROSS-REFERENCE TO RELATED APPLICATION

This application is a continuation of copending International Application No. PCT/DE00/00019, filed Jan. 3, 2000, which designated the United States.

BACKGROUND OF THE INVENTION

Field of the Invention

The invention lies in the telecommunications and signal processing fields. More specifically, the invention relates to a method and device for decoding convolutional codes.

In communication systems, for example such as radio systems, the signal to be transmitted (for example voice signal) is submitted to channel coding after conditioning in a source coder. The channel coding serves the purpose of adapting the signal to be transmitted to the properties of the transmission channel. In the process, effective error protection is achieved by specific introduction of redundancy into the signal to be transmitted.

Binary parallel-concatenated recursive convolutional codes have been investigated for channel coding only for a few years. The designation "turbo codes" has become established for these convolutional codes. In particular, when transmitting large blocks with more than one thousand bits (symbols), a substantially better error protection can be achieved with turbo codes than with the (conventional) convolutional coding. However, it is disadvantageous that the decoding of turbo codes is more complicated than the decoding of (conventional) convolutional codes.

It has been known to utilize an iterative turbo decoder for the purpose of decoding turbo codes. The iterative turbo decoder thereby contains two individual convolutional decoders which are interleaved with one another in a feedback fashion. At least the convolutional decoder provided on the input side must permit soft decoding, that is to say be capable in the case of each received data symbol to determine in addition to, or instead of, a binary output value a value-continuous estimated value for the original, uncoded data symbol on which the received data symbol is based. It is characteristic of iterative turbo decoders that these value-continuous estimated values are fed to the second convolutional decoder as input information in the course of the iteration. Estimated values for original, uncoded data symbols are also denoted below as a first item of reliability information.

The article "Near Shannon Limit Error-Correcting, Coding and Decoding: Turbo-codes (1)" C. Berrou et al., Proc. IEEE Int. Conf. on Communications ICC'93, Genua, 1993, pages 1064 to 1070 describes an iterative turbo decoder whose convolutional decoder on the input side is used to produce the first item of reliability information according to a modified Bahl et al.-algorithm. The second convolutional decoder, which need not produce any reliablity information, can operate, for example, according to the known Viterbi algorithm.

Convolutional decoders which operate according to a symbol-by-symbol MAP (maximum a posteriori) algorithm, are likewise capable of producing a first item of reliability information. Such convolutional decoders are denoted as MAP symbol estimator (or else MAP symbol decoder). They have the advantage that they can be used to achieve the lowest possible bit error ratio.

A detailed description of an iterative turbo decoder with two recursively interleaved MAP symbol estimators can be found in the book "Analyse und Entwurf digitaler Mobilfunksysteme" ["Analysis and Design of Digital Mobile Radio Systems"], by P. Jung, Stuttgart, B. G. Teubner, 1997 on pages 343–68, in particular FIG. E.2.

The problem arises in mobile radio applications that the mobile radio channel is highly time variant, that is to say its transmission properties change continuously because of changing environmental influences. The constant changes in the transmission properties of the mobile radio channel must be taken into account as early as during data detection. For this purpose, a communication terminal used in mobile radio has a channel estimator which is coupled to the data detector and continuously determines the transmission properties (pulse responses) of the mobile radio channel and communicates them to the data detector. Such data detection, which takes account of the instantaneous transmission channel properties, is denoted as adaptive data detection or adaptive equalization.

However, the time variance of the mobile radio channel also influences the decoding which takes place downstream of the adaptive equalization. It is disadvantageous in this regard that the high degree of error protection which can in principle be achieved by turbo decoding is nullified again by the time variance of the mobile radio channel, at least in part.

The article "Combined Turbo Equalization and Turbo Decoding" by D. Raphaeli and Y. Zarai, IEEE Communications Letters, Vol. 2, No. 4, 1998, pages 107–09 describes an iterative receiver structure which is constructed from a combination of an adaptive equalizer and an (iterative) turbo decoder connected downstream of the latter. The term "turbo equalization" has been coined as keyword for such a combined receiver structure. The iterative turbo decoder is also structured here, in turn, from two MAP symbol decoders. In addition to the first item of reliability information, the two MAP symbol decoders, which are denoted in this article as MAP blocks, also calculate a second item of reliability information. The second item of reliability information constitutes a value-continuous estimated value for the original, coded data symbol on which the detected data symbol is based.

The coupling between adaptive equalization and data decoding is realized by virtue of the fact that in each iteration step the iterative turbo decoder generates from the second item of reliability information of the two convolutional decoders a combined item of reliability information which it feeds to the adaptive equalizer as information which is extrinsic (that is to say not produced in the equalizer itself), and that the adaptive equalizer for its part feeds extrinsic information into the turbo decoder. The time variance of the mobile radio channel can be taken into account during the turbo decoding by means of this feedback between the equalizer and turbo decoder. However, it is disadvantageous that the computational outlay, which is already very high in any case for turbo decoding, is further substantially increased by the fact that the equalizer is also incorporated into the iteration cycle.

A simplified version of an iterative turbo decoder for decoding turbo codes is proposed in the article "Novel low complexity decoder for turbo-codes" by P. Jung, Electronics Letters, Vol. 31, No. 2, 1995, pages 86–87. That turbo decoder differs from the previously known turbo decoders in that the two convolutional decoders contained in the turbo decoder operate using a novel, so-called SUBMAP algorithm which, in conjunction with an acceptable deterioration of the decoding performance (that is to say increase in the bit error ratio), permits a substantial saving on computational outlay in the calculation of the first item of reliability information.

Figure 3:
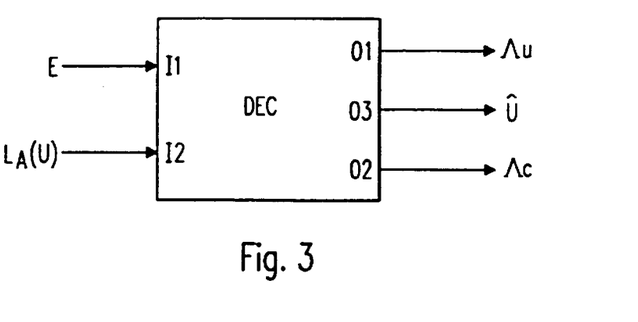
FIG. 3 is a schematic block diagram of a convolutional decoder in accordance with the invention.

In the publication "Combined turbo equalization and turbo decoding", Global Telecommunications Conference (GLOBE-COM), US, New York, IEEE, 1997, pages 639–43, XP00208195 ISBN: 0-7803-4199-6 by Raphaeli et al., a decoder structure is described wherein a sequence of received coded symbols is accepted in accordance with FIG. 3 and the input C1, illustrated there, of the code MAP, a first item of reliability information is calculated for each uncoded symbol in accordance with FIG. 3 and the output L, illustrated therein, of the code MAP block, and a second item of reliability information is calculated for each coded symbol in accordance with FIG. 3 and the output F, illustrated therein, of the code MAP block. Reference is made in the publication to the prior art MAP decoder with reference to determining the second item of reliability information.

A specific modification of the Viterbi decoding algorithm for binary trellis diagrams is proposed in the publication "Source-controlled Channel Decoding" in IEEE Transactions on Communications, US, IEEE INC. New York, Vol. 43, No. 9, Sep. 1, 1995 (1995-09-01), pages 2449–57, XP000525669 ISSN: 0090-6778 by J. Hagenauer. The calculation of a second item of reliability information is not taken into account, however, in that case.

The publication "Comprehensive Comparison on Turbo-Code Decoders" in Proceedings of the Vehicular Technology Conference, US, New York, IEEE, Vol. CONF. 45, 1995, pages 624–28, XP000551609 ISBN: 0-7803-2743-8, by P. Jung et al., discloses a SUB-MAPSSE decoder wherein a second item of reliability information can be determined in a way which is more favorable in terms of outlay.

SUMMARY OF THE INVENTION

The object of the present invention is to provide a method and device for decoding convolutional codes which overcome the above-noted deficiencies and disadvantages of the prior art devices and methods of this general kind, and which produce a second item of reliability information for coded transmitted symbols at the output of a convolutional decoder. In particular, the object is for the method to permit a convolutional code to be decoded more favorably in terms of outlay in a receiver structure comprising a combined equalizer and turbo decoder. The further particular object is to configure a convolutional decoder which provides a second item of reliability information for symbols which are transmitted in code, and can be used, in particular, to implement the combined receiver structure.

With the above and other objects in view there is provided, in accordance with the invention, a method of decoding convolutional codes based on a coding process wherein a sequence of coded symbols is produced from a sequence of uncoded symbols by adding redundancy, the method which comprises the steps of:

receiving a sequence of received coded symbols;

calculating a first item of reliability information for each uncoded symbol, wherein the first item of reliability information is representative of a probability that an $n^{th}$ uncoded symbol under consideration of the sequence of uncoded symbols is equal to a value i of the symbol set, on condition that the sequence of received coded symbols is present;

calculating a second item of reliability information for each coded symbol, wherein the second item of reliability information is representative of a probability that a $k^{th}$ coded symbol under consideration of the sequence of coded symbols is equal to a value i of the symbol set, on condition that the sequence of received coded symbols is present, and thereby determining the second item of reliability information substantially by determining a maximum value of code-dependent product terms of the first item of reliability information.

In other words, the second item of reliability information is determined substantially by the determination of the maximum value of code-dependent product terms of the first item of reliability information. This mode of procedure is particularly convenient, since it is only the already determined first item of reliability information which need be used to calculate the second item of reliability information. This is rendered possible because a coded symbol has a property that it can be represented as a sum (dependent on the specific code) over uncoded symbols.

The first item of reliability information can fundamentally be calculated using any desired algorithm, for example the MAP algorithm. Calculation of the first item of reliability information which is favorable in terms of outlay is achieved, in accordance with an added feature of the invention, by first calculating metric increments $\mu_n^{\ 1}(E,m',m)$, forward recursion values $\delta_n(m)$ and backward recursion values $\epsilon_{n+1}(m')$ with reference to valid transitions between states $m, m'$ of a coder used in the coding process; and the first item of reliability information is determined by determining maximum values of expressions of the form $$\{\delta_n(m)+\mu_n^{\ i}(E,m',m)+\epsilon_{n+1}(m')\},$$

wherein i is the value of the $n^{th}$ uncoded symbol.

In accordance with an additional feature of the invention, a-priori knowledge of the sequence of uncoded symbols is present; and the a-priori knowledge is incorporated into the determination of the first and/or second items of reliability information. That is, if there is a priori knowledge of the sequence of the uncoded symbols, this is expediently incorporated into the determination of the first and/or second item of reliability information.

In accordance with another feature of the invention, the sequence of coded symbols is a sequence containing the sequence of uncoded symbols.

With the above and other objects in view there is also provided, in accordance with the invention, a convolutional decoder which incorporates the above-outlined method. The decoder comprises:

a first input for accepting a sequence of received coded symbols;

a first output for outputting a first item of reliability information;

a device configured to calculate the second item of reliability information as outlined above; and a second output connected to the device for outputting the second item of reliability information.

In accordance with a further feature of the invention, a third output carries, with reference to each uncoded symbol, an estimated value for the uncoded symbol from the symbol set.

In addition to the first output for the first item of reliability information and the second output for the second item of reliability information, the convolutional decoder preferably comprises a third output, at which a "hard" estimated value, that is to say one contained in the symbol set (in the binary case: 0, 1), is provided for each uncoded symbol.

Because it provides the second item of reliability information in a way which is favorable in terms of computational outlay, the convolutional decoder according to the invention can advantageously be used in a turbo decoder which provides a combined item of reliability information which is formed from the second item of reliability information of a first and a second convolutional decoder.

In order to realize "turbo equalization", such a turbo decoder is connected up in terms of feedback to an equalizer in such a way that the combined item of reliability information is fed to an input of the equalizer. Because the invention permits a simplified calculation of the combined item of reliability information, turbo equalization is possible with a computational outlay which is sufficiently low for practical applications.

There is thus provided, in accordance with a preferred embodiment of the invention, a turbo decoder, comprising:

first and second convolutional decoders both producing a second item of reliability information, at least one of the first and second convolutional decoders being formed as outlined above;

wherein a first item of reliability information of the first convolutional decoder is fed to the second convolutional decoder as a priori knowledge of a sequence of uncoded symbols;

wherein the first item of reliability information of the second convolutional decoder is fed back to the first convolutional decoder as a priori knowledge of the sequence of the uncoded symbols; and a logic stage connected to the first and second convolutional decoders for logically combining the second items of reliability information of the first convolutional decoder and of the second convolutional decoder to form a combined item of reliability information.

The turbo decoder is particularly suitable for incorporation in a receiver structure. The turbo decoder is thereby connected to an input of an equalizer in terms of feedback and the equalizer receives from the turbo decoder the combined item of reliability information.

Other features which are considered as characteristic for the invention are set forth in the appended claims.

Although the invention is illustrated and described herein as embodied in a method and device for decoding convolutional codes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
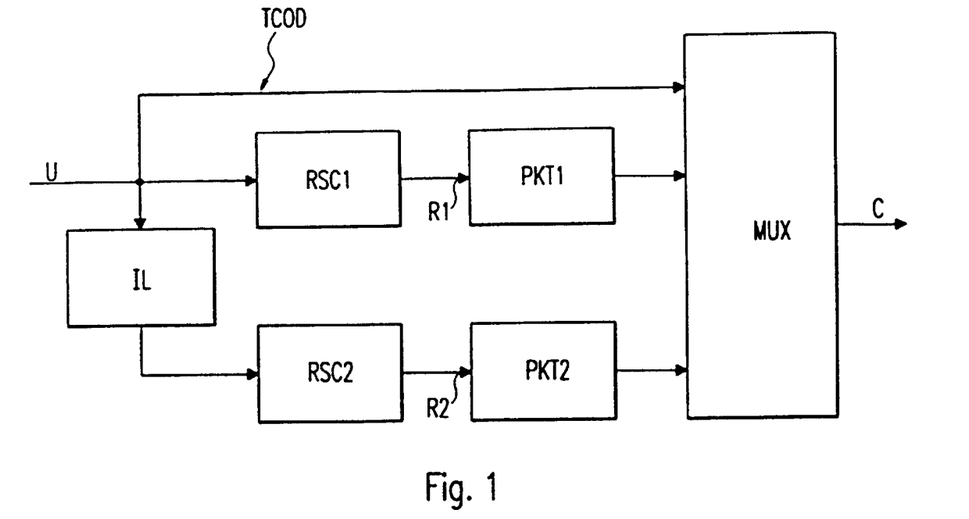
FIG. 1 is a block diagram of a turbo coder for generating a turbo code.

Referring now to the figures of the drawing in detail, a better understanding of the invention will first be gained from a description of a turbo coder TCOD for turbo codes with reference to FIG. 1 and of a convolutional decoder according to the invention with reference to FIG. 3.

The turbo coder TCOD has two identical binary recursive systematic convolutional coders RSC1 and RSC2 which are known in coding technology as RSC (Recursive Systematic Convolutional) coders. Connected on the input side upstream of the second convolutional coder RSC2 is a turbo code interleaver IL, and the outputs of the two convolutional coders RSC1 and RSC2 are connected in each case to a multiplexer MUX via puncturers PKT1 and PKT2, respectively.

A sequence of uncoded symbols at the input of the turbo coder TCOD is denoted by $$U = (u_1, \ldots, u_N) \qquad (1)$$

The sequence U comprises a finite number N of symbols which are identified below with bits for the purpose of simplified representation, that is to say $u_n=0$ or 1 for all $n=1, 2, \ldots, N$. The sequence U is denoted below as the input sequence, and N as the block size of the input sequence.

Two RSC convolutional coders RSC1 and RSC2 generate redundancy which is represented by the redundancy subsequences R1 and R2 with N binary terms, in each case $$R1 = (r_{1,1}, \ldots, r_{1,N}) \qquad (2)$$
$$R2 = (r_{2,1}, \ldots, r_{2,N})$$

The redundancy subsequences R1 and R2 are punctured by the puncturers PKT1 and PKT2, respectively, and the input sequence U as well as the punctured sequences R1 and R2 are fed to the multiplexer MUX. The latter produces at its output an output sequence $$C = (c_1, \ldots, c_K) \qquad (3)$$

which comprises a number K of coded binary symbols.

The ratio $R_c = N/K$ is denoted as coding rate $R_c$ and is a measure of the redundancy added in the turbo coder. The turbo code with the coding rate $R_c = \frac{1}{2}$ is considered below. The output sequence C then comprises twice as many bits as the input sequence U.

If the block size N is an even number, the puncturers PKT1 and PKT2 and the multiplexer MUX produce the output sequence C according to the following rule, for example:

$$c_{2n-1}=u_n \; n=1, \ldots, N \; c_{4n-2}=r_{1,2n-1} \; n=1, \ldots, N/2 \; c_{4n}=r_{2,2n} \; n=1, \ldots, N/2 \qquad (4)$$

When N=4, the output sequence C of the turbo coder TCOD is then yielded in the form $$c=(u_1, r_{1,1}, u_2, r_{2,2}, u_3, r_{1,3}, u_4, r_{2,4}) \qquad (5)$$

The input sequence $U=(u_1, \ldots, u_N)$ is completely contained in the coded output sequence C in the turbo coder TCOD shown in FIG. 1 (see equation 5). Codes with this property are denoted as systematic codes.

The remaining N symbols of the output sequence C are redundancy which goes back in turn to the redundancy subsequences R1 and R2. This redundancy can be integrated in the redundancy sequence R $$R=(r_1, \ldots, r_N) \qquad (6)$$

It holds for the above example that $r_1=r_{1,1}$, $r_2=r_{2,2}$, $r_3=r_{1,3}$, $r_4=r_{2,4}$.

The output sequence C with K=2N terms is therefore constructed alternately of N terms of the input sequence U and from N terms of the redundancy sequence R.

The output sequence C is subsequently subjected to block interleaving (in a way not illustrated), subdivided into suitable data packets (bursts), modulated, amplified in transmitter amplifiers and emitted.

Figure 2:
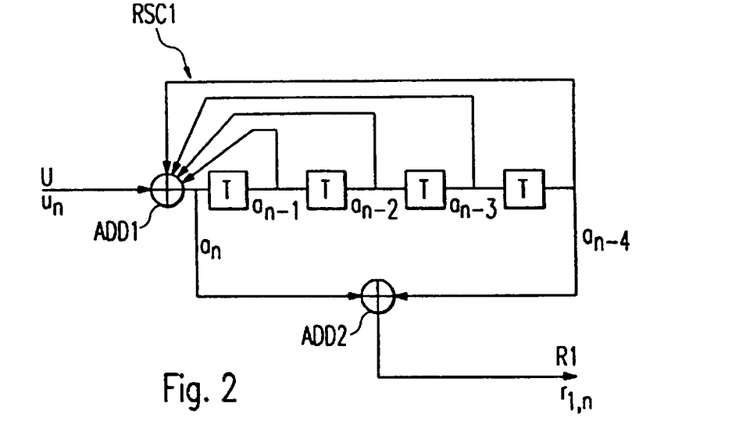
FIG. 2 is a schematic block diagram of an RSC convolutional coder from FIG. 1.

With reference to FIG. 2, there is shown a block diagram of an RSC coder, as can be used in the configuration of FIG. 1 for RSC1 and/or RSC2. On the input side, the RSC coder RSC1 has a first adder ADD1 and a shift register with four cells T which is connected downstream of the adder ADD1. The redundancy subsequence R1 is formed by a second adder ADD2, which adds the input and the output values of the shift register. It is evident that the redundancy bit $r_{1,n}$ of the redundancy subsequence R1 which is present at a specific instant at the output of the RSC coder RSC1 depends on the current input bit $u_n$ of the sequence U of uncoded symbols, and on the state of the shift register. The state of the shift register depends, in turn, on the last four input bits. The number of binary digits (symbols) which are available for a combination in the case of ADD1, that is to say 5 in this case, is denoted as fallback depth L.

The production of the redundancy subsequence R1 from a sequence U of uncoded symbols can be traced directly with the aid of the illustration of FIG. 2. The output sequence C of the turbo coder TCOD then follows from equation 4. Alternatively, it is also possible to use a state diagram, denoted in coding technology as a trellis diagram, of the RSC1 (or TCOD) coder to determine R1 (or C). The trellis diagram of the RSC1 coder with a shift register of 4 cells has $M_T=2^4$ nodes which correspond to the possible states of the shift register. An (arbitrary) first state m, which goes over into a second state m' through the input of an input bit (U=0 or 1), is connected to the second state in the trellis diagram by a connecting line. Each redundancy subsequence R1 then corresponds to a specific path along connecting lines through the trellis diagram of the RSC1 coder.

Trellis diagrams for illustrating the states of coders are known and need not be explained in more detail here.

Referring now to FIG. 3, there is shown a schematic of a convolutional decoder DEC in accordance with the present invention.

The inputs and outputs of DEC are described in the first instance:

Present at a first input I1 of the DEC is a received sequence $$E=(e_1, \ldots, e_K) \qquad (7)$$

which comprises K complex-value samples which are disturbed versions of the coded symbols $c_1$ to $c_K$ of the output sequence C.

According to the structure of the output sequence C, the received sequence E comprises a systematic received sequence $$X=(x_1, \ldots, x_N), \qquad (8)$$

which contains the disturbed systematic information of the sequence U, and a redundancy received sequence $$Y=(y_1, \ldots, y_N) \qquad (9)$$

which contains the disturbed redundancy of the redundancy sequence R (see equation 6).

Since, in accordance with equations (5) and (6), the individual values $y_n$ go back alternately to the redundancy $r_{1,n}$ generated by the first RSC coder RSC1, and to the redundancy $r_{2,n}$ generated by the second RSC coder RSC2, it is also possible for Y to be written as $$Y=(y_{1,1}, y_{2,2}, y_{1,3}, y_{2,4}, \ldots) \qquad (10)$$

that is to say in the form Y=Y1+Y2 with two redundancy received subsequences Y1 and Y2

$$Y1=(y_{1,1}, 0, y_{1,3}, 0, \ldots) \qquad (10a)$$

$$Y2=(0, y_{2,2}, 0, y_{2,4} \ldots) \qquad (10b)$$

As explained in yet more detail below (FIG. 4), it is not necessary for the entire received sequence E to be present at the first input I1, but it is possible, for example, for only the sequences X, Y1 or X, Y2 to be present, depending on the application.

A sequence $L_A(U)$ which contains a priori knowledge on the uncoded symbols $u_1$ to $u_N$ can be present at a second (optional) input I2 of the DEC. The sequence $L_A(U)$ can be written as $L_A(U)=(L_A(u_1), \ldots, L_A(u_N))$, where it being possible for the individual terms to be defined in the binary case in the form of a logarithmic ratio:

$$L_A(u_n) = \log\left\{\frac{P(u_n = 1)}{P(u_n = 0)}\right\} \text{ for } n = 1, \ldots, N. \qquad (11)$$

$P(u_n=1)$ and $P(u_n=0)$ in this case denote the probabilities that $u_n$ is equal to 1 or 0, respectively. If these two events are always, (that is to say for all n=1, ..., N), equally probable, the result is $L_A(U)=(0, \ldots, 0)$, for example.

A first item of reliability information is provided at a first output O1 of the DEC.

Given the first item of reliability information, the conditional probabilities are denoted as $P(u_n=1/E)$ and $P(u_n=0/E)$ for the case wherein the symbol $u_n$ is equal to 1 or equal to 0, respectively, under the condition that the received sequence E is present. These conditional probabilities are "a posteriori probabilities", since the probabilities of the uncoded $u_1$ to $u_N$ on which an event (the detected received sequence E) which has occurred is based and deduced from this event.

In the binary case, the first item of reliability information can be represented as a sequence $\Lambda_u$ where $$\Lambda_U=(\Lambda(u_1), \ldots, \Lambda(u_N)) \qquad (12)$$

from N complex-value terms $\Lambda(u_n)$, n=1, ..., N. The sequence terms $\Lambda(u_n)$ can be written as the logarithmic ratio of the conditional probabilities $$\Lambda(u_n) = \log\left\{\frac{P(u_n = 1 \mid E)}{P(u_n = 0 \mid E)}\right\} \qquad (13)$$

and can be interpreted as value-continuous a posteriori estimated values for the uncoded data symbols $u_1$ to $u_N$ of the received sequence U.

Given the additional presence of a priori knowledge $L_A(U)$ on the uncoded symbols $u_1, \ldots, u_N$, this can be incorporated in the calculation of the first item of reliability information in accordance with the conditional probabilities $P(u_n=1/E, L_A(U))$ and $P(u_n=0/E, L_A(U))$, respectively.

A second item of reliability information is provided at a second output O2 of the DEC.

Given the second item of reliability information, the conditional probabilities are denoted as $P(c_k=1/E)$ and $P(c_k=0/E)$ for the case wherein the coded symbol $c_k$ is equal to 1 or equal to 0, respectively, under the condition that the received sequence E is present. Given the additional presence of a priori knowledge $L_A(U)$ on the uncoded symbols, $u_1, \ldots, u_N$, the corresponding conditional probabilities $P(c_k=1/E, L_A(U))$ and $P(c_k=0/E, L_A(U))$, respectively, can also be considered.

In the binary case, the second item of reliability information can be represented in a way similar to the first as a sequence $\Lambda_c$ of K complex-value terms $\Lambda(c_k)$, $k=1, \ldots, K$.

$$\Lambda_c = (\Lambda(c_1), \ldots, \Lambda(c_K)) \quad (14)$$

The sequence terms $\Lambda(c_k)$ are a posteriori estimated values for the coded data symbols $c_1$ to $c_k$. They can be written as follows in the notation previously explained:

$$\Lambda(c_k) = \log\left\{\frac{P(c_k=1|E)}{P(c_k=0|E)}\right\}, \quad K=1, \ldots, K \quad (15)$$

As already explained, instead of the received sequence E it is also possible for only a received subsequence (for example X and Y1) to be present at the first input I1 of DEC. In this case, the received sequence E is to be replaced in the above equations by the corresponding subsequence (X and Y1). It may also be pointed out that the second item of reliability information need not be calculated as a rule for all K terms of $c_k$. Given a systematic code, the second item of reliability information must be determined at most for the redundancy R (N terms), that is to say $\Lambda(r_n)$, included in C. It is to be noted furthermore, that the first and second items of reliability information need not (even in the binary case) necessarily be provided at the outputs O1 and O2 of the DEC in the representation used here as a logarithmic ratio of probabilities (what is termed the LLR (Log-Likelihood Ratio) representation.

A sequence $$\hat{U} = (\hat{u}_1, \ldots, \hat{u}_N) \quad (16)$$

of "hard" estimated values $\hat{u}_n=0, 1$; $n=1, \ldots, N$ for the values $u_n$ of the original input sequence U can be output at a third (optional) output O3 of the DEC on the basis of the received sequence E and, if appropriate, the a priori knowledge $L_A(U)$.

Which calculation rule is used to generate the first item $\Lambda_u$ and second item $\Lambda_c$ of reliability information is now decisive for the decoding.

A calculation rule according to the invention for determining the first item $\Lambda_u$ and second item $\Lambda_c$ of reliability information is specified below:

firstly, the metric increments $$\mu_n^i(E, m', m) \quad (17)$$

between the states m and m' connected in the trellis diagram by a connecting line are calculated in the usual way in the convolutional decoder DEC. In this case, n denotes the instant and i the value (0 or 1) of a bit of the input sequence U of the coder, that is to say $u_n=i$.

Because of E, the metric increments $\mu_n^i(E,m',m)$ depend on the transmission properties of the transmission channel (mobile radio channel). In the case of a "memory less" Gaussian transmission channel, that is to say what is termed an AWGN (Additive White Gaussian Noise) channel, wherein the influence of the channel on sequential symbols of the output sequence is independent of one another (which can also be achieved, if appropriate, by interleaving), the metric increments can be determined as follows, for example:

$$\mu_n^i(E, m', m) = \left\{\frac{a_n}{\sigma^2}x_n + \frac{1}{\sigma_L^2}L_A(u_n)\right\}(2i-1) + \frac{a_n}{\sigma^2}y_{1,n}(2r_{1,n}-1) \quad (18)$$

where $\sigma^2$ is the variance of the Gaussian noise, $a_n$ is the real amplitude of $e_n$, $\sigma_{LL}^2$ is the variance of the extrinsic information $L_A(u_n)$, i is the hypothetical uncoded information (that is to say 0 or 1), $r_{1,n}$ is the generated redundancy, defined in equation (2), of the first coder, and $y_{1,n}$ is the corresponding redundancy, received in a disturbed fashion, according to equation (10a).

Also calculated are the forward recursion values $$\delta_n(m) = \max_{m' < m}\{u_n^1(E, m', m) + \delta_{n-1}(m'), \mu_n^0(E, m', m) + \delta_{n-1}(m')\} \quad (19a)$$

and the backward recursion values $$\varepsilon_n(m) = \max_{m' > m}\{u_{n+1}^1(E, m, m') + \varepsilon_{n+1}(m'), \mu_{n+1}^0(E, m, m') + \varepsilon_{n+1}(m')\} \quad (19b)$$

m'<m comprising all m' which are predecessors (predecessor states) of m in the trellis diagram, and m'<m comprises all m' which are successors (successor states) of m in the trellis diagram.

The estimated values are subsequently calculated for the first item of reliability information $$\Lambda(u_n) = \max_{m \Leftrightarrow m'}\{\delta_n(m) + \mu_n^1(E, m, m') + \varepsilon_{n+1}(m')\} - \quad (20)$$

$$\max_{m \Leftrightarrow m'}\{\delta_n(m) + \mu_n^0(E, m, m') + \varepsilon_{n+1}(m')\}$$

Here, the abbreviation m⇔m' denotes the set of all states m, m' which belong to valid transitions in the trellis diagram.

The calculation of the estimated values for the second item of reliability information $\Lambda_c$ is examined below:

Since, given the systematic code considered here, the output sequence C of the coded symbols is composed of the (unchanged) input sequence U and the "parasitic" redundancy sequence R, to calculate $\Lambda_c$ it is enough to calculate the sequence, contained therein, of the second item of reliability information $\Lambda_R=(\Lambda(r_i), \ldots, \Lambda(r_N))$.

The estimated values can be calculated, purely by way of example and not in a way covered by the invention, for the second item of reliability information $\Lambda_R$ in the following way:

$$\Lambda(r_n) = \max_{m \Leftrightarrow m'}\{\delta_n(m) + \mu_n^{r_n=1}(E, m, m') + \varepsilon_{n+1}(m')\} - \quad (21)$$

$$\max_{m \Leftrightarrow m'}\{\delta_n(m) + \mu_n^{r_n=0}(E, m, m') + \varepsilon_{n+1}(m')\}$$

Here, $r_n$ is the redundancy bit, generated at the instant n (that is to say by $u_n$), in the output sequence C.

In accordance with the present invention, the second item of reliability information is determined, however, according to the calculation rule $$\Lambda(r_n)=\text{sign}(\Lambda(u_n)\cdot\Lambda(u_{n-1}))_{RPT}\cdots\cdot\Lambda(u_{n-L+1}))_{RPT}\max\{\Lambda(u_n),\Lambda(u_{n-1}),\ldots,\Lambda(u_{n-L+1})\} \quad (22)$$

This calculation rule is based on the fact that a coded (redundancy) bit $r_n$ can always be written as the sum of L uncoded bits $u_n$, $u_{n-1}$, ..., $u_{n-L+1}$. The second item of reliability information according to equation 22 can therefore be calculated solely from product terms of the first item of reliability information. RPT in this case denotes the set of all "relevant product terms", which depends on the code selected.

Figure 2A:
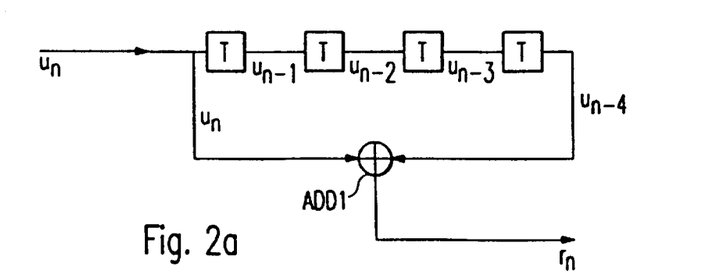
FIG. 2a is a schematic block diagram of a non-recursive convolutional coder.

The set RPT is specified below by way of example for two specific codes:

A non-recursive code of the fallback depth L=5 is generated by the (non-recursive) coder illustrated in FIG. 2a. With reference to this code, the second item of reliability information is determined by $$\Lambda(r_n)=\text{sign}(\Lambda(u_n)\cdot\Lambda(u_{n-4}))\max\{\Lambda(u_n),\Lambda(u_{n-4})\} \quad (22a)$$

that is to say the set RPT of the relevant product terms comprises here the Lth and the (L−4)th term of the first item of reliability information, since a coded bit $r_n$ can be written as the sum of the uncoded bits $u_n$ and $u_{n-4}$.

The second item of reliability information is determined recursively in accordance with $$\Lambda(r_n)=\text{sign}(\Lambda(a_n)\cdot\Lambda(a_{n-4}))\max\{\Lambda(a_n),\Lambda(a_{n-4})\}$$

using the recursion rule $$\Lambda(a_n)=\text{sign}(\Lambda(u_n)\cdot\Lambda(a_{n-1})\cdots\cdot\Lambda(a_{n-4}))\max\{\Lambda(u_n),\Lambda(a_{n-1}),\ldots,\Lambda(a_{n-4})\} \quad (22b)$$

for the recursive convolutional coder RSC1 (fall back depth likewise L=5) illustrated in FIG. 2, since a coded bit $r_n$ (which corresponds in the notation of equation (2) to the bit $r_{1,n}$) can be written as the sum of the states $a_n$ and $a_{n-4}$ of the shift register.

Figure 4:
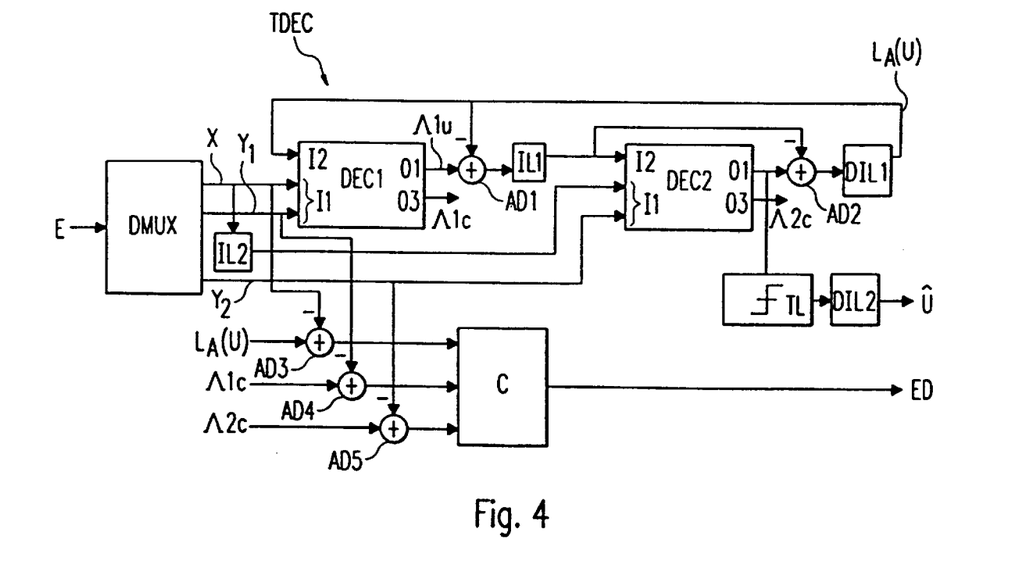
FIG. 4 is a schematic block diagram of a turbo decoder which uses the convolutional decoder illustrated in FIG. 3.

FIG. 4 shows a block diagram of a turbo decoder TDEC, which comprises two convolutional decoders DEC1, DEC2 according to the invention.

The received sequence E is separated in a demultiplexer DMUX into the individual received sequences X (systematic information), Y1 (redundancy of RSC1) and Y2 (redundancy of RSC2).

The sequences X and Y1 are fed to the first input I1 of a first convolutional decoder DEC1. The convolutional decoder DEC1 corresponds substantially to the convolutional decoder DEC shown in FIG. 3, the first input I1 not receiving the entire received sequence E, but only the (already separated) subsequences X and Y1 here, because of the upstream demultiplexer DMUX.

Present at the second input I2 of the first convolutional decoder DEC1 is extrinsic information $L_A(U)$ which depends exclusively on the received sequence U and goes back to the first item of reliability information which is output by the second convolutional decoder DEC2.

First reliability information generated by the first convolutional decoder DEC1, for example, calculated using equation 20, is designated by $\Lambda 1_u$ and provided at the first output O1 of DEC1. Second reliability information generated by the first convolutional decoder DEC1 is denoted by $\Lambda 1_c$, calculated according to the invention using equation 22 (or equation 22a,b), and made available at the second output O2 of DEC1.

The first item of reliability information $\Lambda 1_u$ is then input as extrinsic information at the second input I2 of the second convolutional decoder DEC2 via an adder AD1, whose other inverting adder input is connected to $L_{A(u)}$, and via an interleaver IL1. The received redundancy subsequence Y2 and the systematic received sequence X, possibly previously interleaved in an interleaver IL2 are present at the first input I1 of the second decoder DEC2.

The first item of reliability information produced by the second convolutional decoder DEC2 is denoted by $\Lambda 2_u$, for example calculating using equation 20 and provided at the first output O1 of DEC2. The second item of reliability information produced by the second convolutional decoder DEC2 is denoted by $\Lambda 2_c$, calculated according to the invention using equation 22 (or equation 22a,b), and provided at the second output O2 of DEC2.

The first item of reliability information $\Lambda 2$ of DEC2 is input at an adder AD2, whose other inverting input is connected to the second input I2 of the second convolutional decoder DEC2. On the output side, the adder AD2 is connected to the input of a deinterleaver DIL1 whose output provides the already mentioned extrinsic information $L_A(U)$ for the first convolutional decoder DEC1.

The first item of reliability information $\Lambda 2_U$ of DEC2 is further used to determine a sequence of estimated values $\hat{U}=(\hat{u}_1,\ldots,\hat{u}_N)$ for the input sequence U. For this purpose, $\Lambda 2_u$ is provided to a threshold logic circuit TL which decides that $\hat{u}_N=0$ when $\Lambda 2_u(u_n)\leq 0$, and that $\hat{u}_n=1$ when $\Lambda 2_u(u_n)>0$.

The output of the threshold logic circuit TL is connected to a deinterleaver DIL2 which outputs the sequence $\hat{U}$ in the correct symbol sequence.

The second items of reliability information $\Lambda 1_c$ and $\Lambda 2_c$ determined according to the invention are used in order to determine a combined item of reliability information from extrinsic data ED, which is required in order to permit turbo equalization. Turbo equalization can be achieved by an iterative combination of an equalizer with the turbo decoder TDEC shown in FIG. 4 (see FIG. 5).

In order to determin ED, $L_A(U)$, $\Lambda 1_c$ and $\Lambda 2_c$ are respectively led to adders AD3, AD4 and AD5 whose respective other, inverting inputs are connected to X, Y1 and Y2, respectively. The outputs of the adders AD3, AD4 and AD5 are suitably combined in a logic stage C, the extrinsic data ED being formed.

Figure 5:
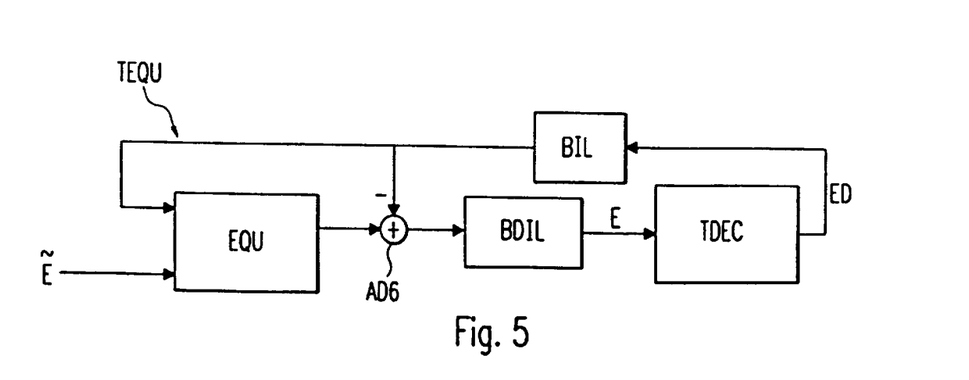
FIG. 5 is a block diagram of an iterative receiver structure according to the invention comprising a combination of an equalizer with the turbo decoder of FIG. 4.

FIG. 5 shows schematically the design of a receiver structure TEQU which implements turbo equalization. An adaptive equalizer (comprising a channel estimator and a data detector) EQU receives at a first input original received data $\tilde{E}$ which are output by a demodulator stage (mixer, A/D converter, filter) (not illustrated) of an RF receiver. The equalizer EQU uses training sequences in the emitted signal which are known to it for continuous determination of the current channel transmission parameters (channel pulse responses) of the mobile radio channel, and carries out data detection of the symbols (still interleaved at this instant) of the original received sequence $\tilde{E}$ with the aid of the determined current channel transmission parameters.

Data output by the equalizer EQU are fed to a first input of an adder AD6 whose output is connected to the input of a block deinterleaver BDIL. The reconstructed symbols of the output sequence C, that is to say the received sequence E, are present at the output of the blockdeinterleaver BDIL. As already described, this received sequence is fed to the turbo decoder TDEC.

The extrinsic data ED generated by the turbo decoder TDEC are fed back via a block interleaver BIL to a second input of the adder AD6 and to an input of the equalizer EQU intended for extrinsic information. The low computational outlay in the calculation of the second item of reliability information permits the iterative equalization to be carried out in an acceptable time.

We claim:

1. A method of decoding convolutional codes based on a coding process wherein a sequence of coded symbols is produced from a sequence of uncoded symbols by adding redundancy, the method which comprises the steps of:

receiving a sequence of received coded symbols;

calculating a first item of reliability information for each uncoded symbol, wherein the first item of reliability information is representative of a probability that an $n^{th}$ uncoded symbol under consideration of the sequence of uncoded symbols is equal to a value i of the symbol set, on condition that the sequence of received coded symbols is present;

calculating a second item of reliability information for each coded symbol, wherein the second item of reliability information is representative of a probability that a $k^{th}$ coded symbol under consideration of the sequence of coded symbols is equal to a value i of the symbol set, on condition that the sequence of received coded symbols is present, and thereby determining the second item of reliability information substantially by determining a maximum value of code-dependent product terms of the first item of reliability information.

2. The method according to claim 1, wherein the step of calculating the first item of reliability information comprises first calculating metric increments $\mu_n^i(E,m',m)$, forward recursion values $\delta_n(m)$ and backward recursion values $\epsilon_{n+1}(m')$ with reference to valid transitions between states m, m' of a coder used in the coding process; and determining the first item of reliability information by determining maximum values of expressions of the form $$\{\delta_n(m)+\mu_n^i(E,m',m)+\epsilon_{n+1}(m')\},$$

wherein i is the value of the $n^{th}$ uncoded symbol.

3. The method according to claim 1, wherein a-priori knowledge of the sequence of uncoded symbols is present; and the a-priori knowledge is incorporated into the determination of one of the first and second items of reliability information.

4. The method according to claim 1, wherein the sequence of coded symbols is a sequence containing the sequence of uncoded symbols.

5. A convolutional decoder, comprising:

a first input for accepting a sequence of received coded symbols;

a first output for outputting a first item of reliability information for each of the coded symbols, the first item of reliability information representing a probability that an $n^{th}$ uncoded symbol under consideration of the sequence of uncoded symbols is equal to a value i of the symbol set, on condition that the sequence of received coded symbols is present;

a device configured to calculate a second item of reliability information for each of the coded symbols, the second item of reliability information representing a probability that a $k^{th}$ coded symbol under consideration of the sequence of coded symbols is equal to a value i of the symbol set, on condition that the sequence of received coded symbols is present, and thereby determining the second item of reliability information substantially by determining a maximum value of code-dependent product terms of the first item of reliability information; and a second output connected to said device for outputting the second item of reliability information.

6. The convolutional decoder according to claim 5, which comprises a third output carrying, with reference to each uncoded symbol, an estimated value for the uncoded symbol from the symbol set.

7. A turbo decoder, comprising:

first and second convolutional decoders both producing a second item of reliability information, at least one of said first and second convolutional decoders including:

a first input for accepting a sequence of received coded symbols;

a first output for outputting a first item of reliability information for each of the coded symbols, the first item of reliability information representing a probability that an $n^{th}$ uncoded symbol under consideration of the sequence of uncoded symbols is equal to a value i of the symbol set, on condition that the sequence of received coded symbols is present;

a device configured to calculate a second item of reliability information for each of the coded symbols, the second item of reliability information representing a probability that a $k^{th}$ coded symbol under consideration of the sequence of coded symbols is equal to a value i of the symbol set, on condition that the sequence of received coded symbols is present, and thereby determining the second item of reliability information substantially by determining a maximum value of code-dependent product terms of the first item of reliability information;

a second output connected to said device for outputting the second item of reliability information; and a third output carrying, with reference to each uncoded symbol, an estimated value for the uncoded symbol from the symbol set;

wherein a first item of reliability information of said first convolutional decoder is fed to the second convolutional decoder as a priori knowledge of a sequence of uncoded symbols;

wherein the first item of reliability information of said second convolutional decoder is fed back to said first convolutional decoder as a priori knowledge of the sequence of the uncoded symbols; and a logic stage connected to said first and second convolutional decoders for logically combining the second items of reliability information of said first convolutional decoder and of said second convolutional decoder to form a combined item of reliability information.

8. In combination with a receiver structure, the turbo decoder according to claim 7, and the combination further comprising an equalizer having an input feedback-connected to said turbo decoder for receiving from said turbo decoder the combined item of reliability information.

* * * * *